Aug. 14, 1973 M. L. WHITE 3,752,717

MOUNTING MEDIA FOR SEMICONDUCTOR FABRICATION

Filed Aug. 5, 1971 2 Sheets-Sheet 1

MOUNTING MEDIA FOR SEMICONDUCTOR FABRICATION

United States Patent Office 3,752,717
Patented Aug. 14, 1973

3,752,717
MOUNTING MEDIA FOR SEMICONDUCTOR FABRICATION

Malcolm Lunt White, Bethlehem, Pa., assignor to Bell Telephone Laboratories, Incorporated, Murray Hill, N.J.

Filed Aug. 5, 1971, Ser. No. 169,305
Int. Cl. H01l 7/50; B32b 33/00
U.S. Cl. 156—17 12 Claims

ABSTRACT OF THE DISCLOSURE

Two hydrocarobn compounds, fluorene and docosane, are especially useful as temporary mounting media during various stages of processing semiconductor devices, and, in particular, for processing silicon integrated circuit chips. These compounds have an advantage over waxes in that they leave no contaminating residues upon vaporization when exposed to a source of heat, such as a thermode pickup device.

BACKGROUND OF THE INVENTION

(1) Field of the invention

The invention relates to the fabrication of semiconductor devices, including integrated circuits.

(2) Description of the prior art

In the fabrication of semiconductor devices, it is convenient to take wafers or slices of semiconductor material, which are then doped in some fashion to form n-type and p-type conductivity regions. Circuits are usually formed by selective etching and deposition of both oxide and metallic layers. In the art of producing integrated circuits, hundreds of repetitive circuit patterns on one slice can be fabricated in such a manner. Having prepared complete circuits, it is next desirable to temporarily bond the slice to a substrate, with the active side (the circuitry) facing the substrate surface. This permits lapping and polishing of the back side of the slice to reduce its thickness and etching of the slice in an aqueous chemical etchant to separate and form the individual circuit-containing chips and beam leads for interconnection to other circuitry on other substrates, such as to thin film metal circuits on ceramic substrates.

Many materials that would bond the slice firmly to the substrate, yet would be easily removed when the desired operations are completed, have been proposed or used. In order to avoid being a potential source of contamination to the circuitry on the chips, however, it is necessary that such a "temporary adhesive" be completely removed.

Inorganic hydrated salts have been proposed as a temporary mounting medium for mechanical cutting and shaping operations (James Godfrey, U.S. Pat. No. 2,984,-897, issued May 23, 1961, and assigned to the same assignee of this application). These salts are completely soluble in water and may be removed without leaving any contaminating residues. This same property of high solubility in water, however, limits their use in applications requiring etching the wafer in an aqueous medium.

Paraffin, beeswax, and other wax-like substances, are now usually used for temporarily securing semiconductor slices and chips for processing semiconductor devices. These temporary adhesives are generally used because of their good adhesion and their solubility in organic solvents, thus facilitating removal of the chips from the substrates.

However, an alteration in the method of preparing chips for bonding to a thin film circuit may also be contemplated: a heated device with vacuum-assist pickup may be used for removing the chips from the mounting medium. Such a device, which may be referred to as a thermode tip, has been disclosed, for example, by P. Mallery, Ser. No. 864,367, filed Oct. 7, 1969, and assigned to the same assignee of this application and now U.S. Pat. 3,604,108 issued Sept. 14, 1971. The thermode tip is usually operated below 400° C. in order to avoid the deleterious effects that excess heat would have on the circuit chips. In attempting to use such a device, however, it has been observed that the mounting media described above, especially the waxes and paraffins, tend to pyrolyze and decompose rather than vaporize, thus leaving residues that are only slightly, if at all, soluble in common solvents. These residues then tend to contaminate the chip and thereby affect the operation of the circuitry.

As a result of the introduction of the thermode tip into the processing of integrated circuit chips and the desirability of using a water-insoluble temporary adhesive, the two classes of compounds described above, that is, waxes and hydrated inorganic salts, cannot be used. What is needed is a temporary mounting medium that is insoluble in water, is acid-resistant, and is easily removed. For the applications envisioned, no contaminating residues may be allowed to remain on the device when the adhesive is exposed to heat sufficient to vaporize it.

SUMMARY OF THE INVENTION

In accordance with the invention, three aromatic hydrocarbon compounds and two straight chain alkane hydrocarbon compounds are useful as mounting media in various stages of processing semiconductor devices, including integrated circuits. The three aromatic compounds include fluorene, phenanthrene, and anthracene, while the two straight chain alkanes include eicosane and docosane. These hydrocarbon compounds can sufficiently bond the semiconductor slices and circuits to a substrate so that the operations contemplated in the course of fabricating semiconductor devices may be carried out. These hydrocarbon compounds, when exposed to sufficient heat, vaporize completely without leaving any traces of residues that might contaminate the devices. Moreover, these hydrocarbon compounds are chemically inert to the aqueous acid etchants commonly used in processing the devices.

The use of such "evaporative adhesives" for temporarily bonding semiconductor slices to substrates is contemplated during the operations of lapping, polishing, and etching into individual chips. The aromatic hydrocarbon compound fluorene is a preferred example of the hydrocarbon compound intended for use in this fashion.

On the other hand, for temporarily bonding semiconductor circuit chips to a transparent substrate during the operations of visual inspection, temporary storage, and shipping, docosane, or a mixture of straight chain hydrocarbon compounds containing at least 90 weight percent docosane, is a preferred example. The lower melting points of such mixtures (as compared with, for example, fluorene) result in a tackiness that bonds circuit chips to the substrate, yet permits some freedom of lateral movement.

Figure 1:
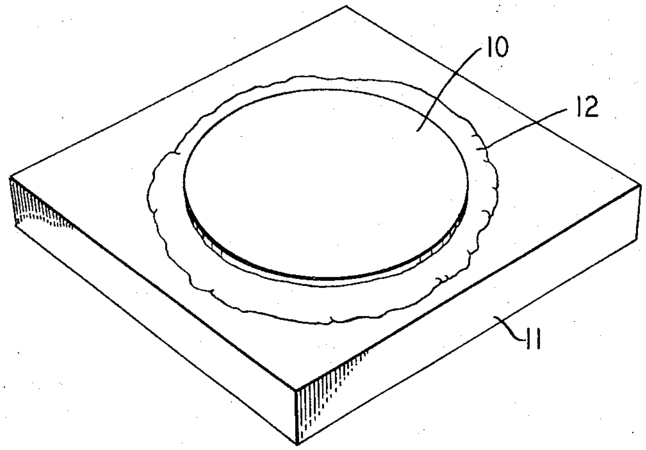
FIG. 1 is a perspective view of a semiconductor slice, prior to etching the slice into individual integrated circuit chips and their beam leads. The slice, or wafer, is mounted on a substrate, using an evaporative adhesive in accordance with the invention.

DETAILED DESCRIPTION OF THE INVENTION (1) Evaporative adhesive hydrocarbon compounds In order to bond semiconductor slices to substrates for processing into final products, such as integrated circuit chips, the adhesive used must be insoluble in water, resistant to the acids normally used in such processing, and easily removed. Where the use of a thermode tip is contemplated, the adhesive must vaporize completely without decomposing and leave no contaminating residues on the semiconductor slice or chip. Moreover, this adhesive must bond the semiconductor slice to the substrate sufficiently for the processing operations envisioned.

In accordance with the invention, certain hydorocarbon compounds meet all of these requirements. However, in order to avoid deleterious effects on the volatilization properties of these compounds or to present a possible source of contamination to the circuitry on the semiconductor slice, these hydrocarbon compounds must be essentially pure. That is, the inclusion of only up to about one weight percent of material containing elements other than hydrogen or carbon is permissable.

The processing steps in which the evaporative adhesives are proposed for use may be arbitrarily divided into two classifications. In the first class are the operations of mechanical lapping and polishing and chemical etching, which are used for reducing the thickness of the semiconductor slices. Three evaporative adhesive compounds which will bond the slice sufficiently for these operations are all aromatic hydrocarbon compounds. They include fluorene

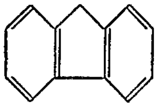

phenanthrene

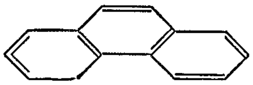

and anthracene

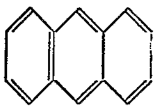

For environments where human beings are involved, as in assembly-line operations, fluorene is preferred, as the other two compounds are carcinogenic.

The second class of operations deal with storing completed semiconductor integrated circuit chips. Such storage is intended to be temporary, in order to perform final visual and electronic inspection of the chips or to transfer the chips to another location for final assembly into other circuitry. Two other hydrocarbon compounds are useful for these operations, where the lower melting point of these adhesives is an advantage for rapid positioning of the chips during inspection and where the transparency of these compounds is useful during visual inspection. These two evaporative adhesive compounds are the straight chain alkanes eicosane (n-$CH_3(CH_2)_{18}CH_3$) and docosane (n-$CH_3(CH_2)_{20}CH_3$).

In purifying these higher molecular weight straight chain alkanes, it is generally difficult to prevent the inclusion of the neighboring straight chain alkanes ranging from octadecane (n-$CH_3(CH_2)_{16}CH_3$) to tetracosane (n-$CH_3(CH_2)_{22}CH_3$). Moreover, in the processing steps of temporary storage and inspection, it is actually preferable to use an amorphous adhesive having a relatively broad range of melting points. As a result of these considerations, up to ten percent of minor constituents may be added or included in either the eicosane or docosane compounds. These minor constituents may be selected from the series of straight chain alkanes ranging from octadecane (n-$CH_3(CH_2)_{16}CH_3$) to tetracosane (n-$CH_3(CH_2)_{22}CH_3$)

inclusive.

In general, the eicosane mixtures have lower melting points than the docosane mixtures. Moreover, the melting points of the former mixtures are sufficiently low (melting point: about 36° C.) so that the intense illumination used in the visual inspection step is sufficient to soften any of the eicosane mixtures, thereby reducing their adhesive properties. Thus, the docosane mixtures and docosane, itself, are preferred examples (melting point: about 44° C.).

For bonding the slice or chip to the substrate, a coating of the hydrocarbon compound or mixture is applied to the substrate, and the slice or chip is positioned in place. The hydrocarbon compound or mixture may be in the molten state before the slice or chip is positioned in place, or, alternatively, may be heated subsequent to the slice or chip placement. Finally, since these compounds vaporize before decomposing, they may, if desired, be vapor-deposited onto selected areas through the conventional techniques of masking. Moreover, since these evaporative adhesive compounds do not degrade on heating, they may, if desired, be reclaimed and recycled.

(2) The drawing

In FIG 1, semiconductor slice 10 is mounted on substrate 11 by the use of adhesive 12. As a result of the good adhesive characteristics of the aromatic hydrocarbon compounds contemplated for use as "evaporative adhesives," a slice can be processed through the operations of polishing and lapping (to reduce its thickness), followed by chemical etching (to form individual chips 31 with beam leads 32). While the adhesive strength of these compounds is about one-twentieth that of the waxes now in use, this strength is nevertheless sufficient to prevent any lateral movement of the slice or the chips during the mechanical processing. As a result of the high vapor pressure of the adhesive, there will be no contamination of the chip by the adhesive following its vaporization during removal of the chips from the substrate. An example of the hydrocarbon compound contemplated for use in this application is fluorene.

Figure 2:
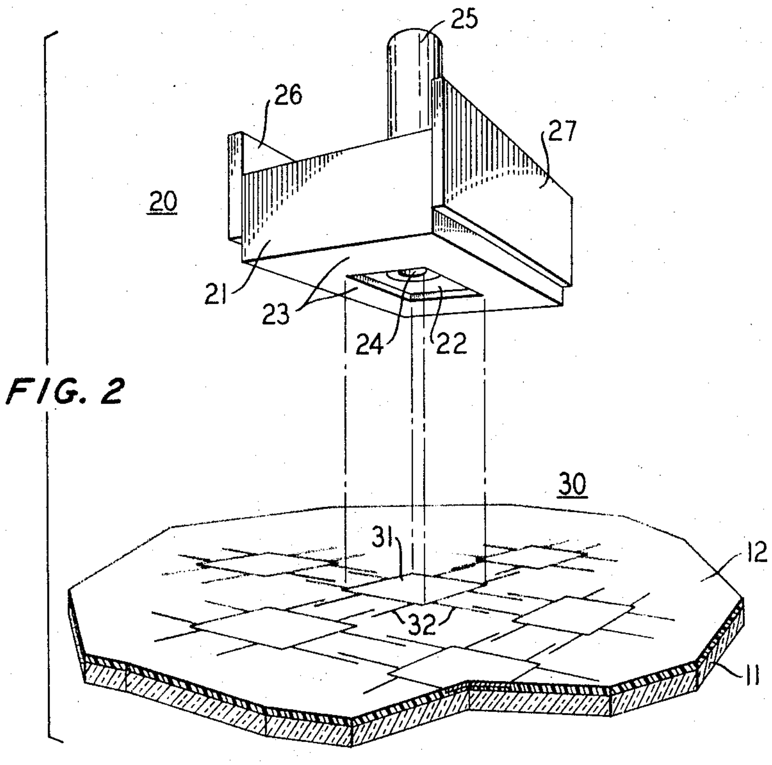
FIGS. 2, 3, and 4 are perspective views illustrating the operating sequences of a thermode tip in picking up a chip embedded in the adhesive in accordance with the invention.
Figure 3:
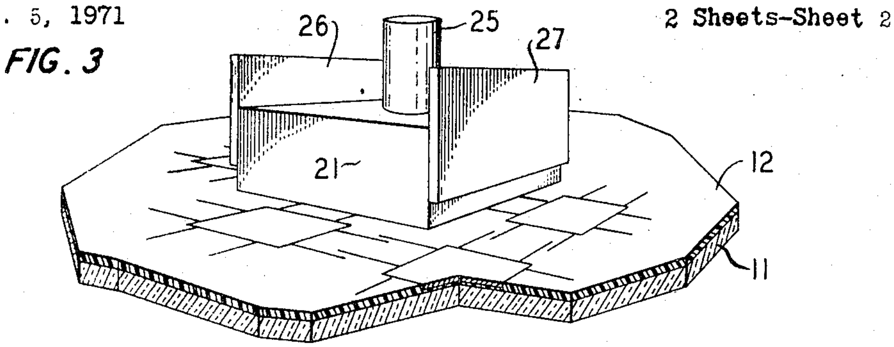
Figure 4:
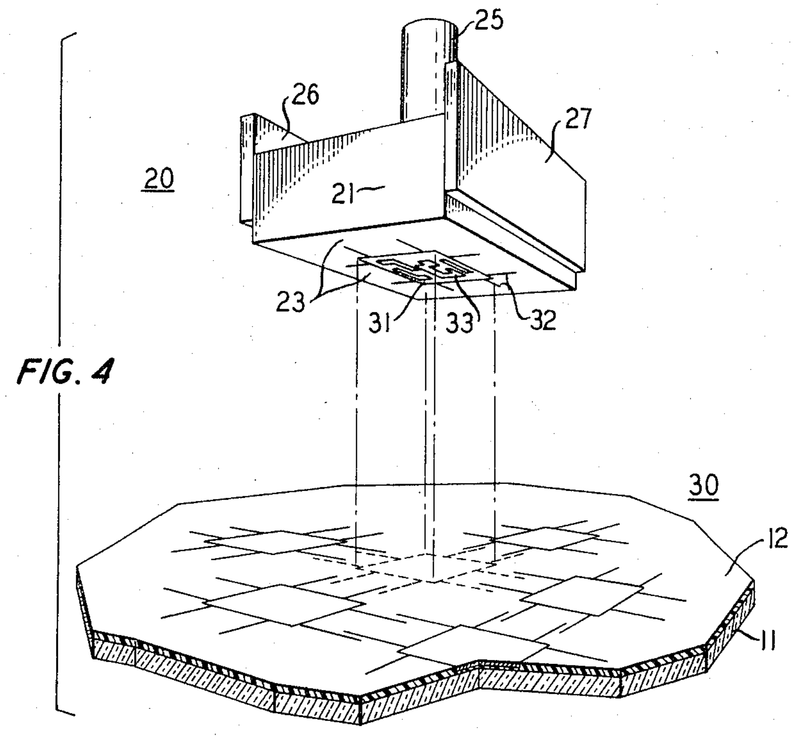

In FIGS. 2, 3, and 4, a large number of beam-leaded chips 30 are arrayed in the adhesive 12 following the chemical etching of the slice 10. The sequence of figures depicts the picking up of an individual chip 31 with its beam leads 32 by a thermode tip 20, shown here in simplified form. Basically, the thermode tip 20 is comprised of a block-shaped head 21 having an interior chamber 22 defined by exterior edges 23. The dimensions of the chamber are dictated by the size of the integrated circuit chips. An orifice 24 opening into the chamber 22 is connected to a vacuum line 25 which, in turn, is connected to a vacuum source, not shown here. The block 21 is heated by the attached strips 26, 27, which are, in turn, connected to a heating source, not shown. In FIG. 3, the thermode tip 20 is lowered until its edges 23 contact the beam leads 32 of a particular device 31. At this stage, the adhesive 12, in which the device 31 is embedded, is in its solid state. With the head edges 23 in contact, the head 21 is heated and a vacuum is applied to the chamber 22 through the vacuum line 25. As a result, the adhesive in the immediate vicinity of the chip 31 is melted and the chip is held by its leads 32 to the edges 23. While the adhesive is still molten, the thermode tip 20 is lifted, as shown in FIG. 4. During the lifting operation, the heat of the head 21 may be brought to a temperature sufficient to completely vaporize any adhesive remaining on the chip 31 without damaging the circuitry 33 on the chip. Alternatively, the heat of the head 21 may be maintained at a temperature sufficient to vaporize the solid adhesive 12 in the immediate vicinity of the chip 31.

Figure 5:
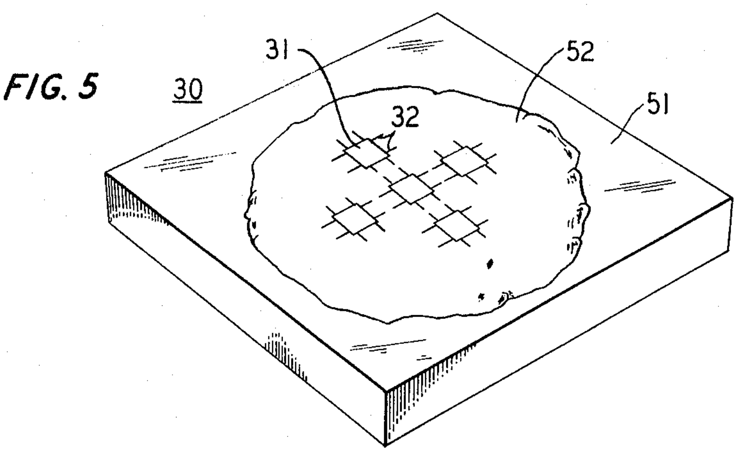
FIG. 5 is a perspective view of an expanded array of chips embedded in an evaporative adhesive on a transparent substrate ready for visual inspection, storage, and shipping to another location.

At this stage, one of two procedures can be followed, depending on the facilities of the practitioner. Normally, the chip 31 can now be directly bonded to thin-film circuitry on a metallized ceramic substrate, not shown here, and the entire arrangement prepared for final processing and encapsulation. Alternatively, it may be desirable to inspect the chips or to ship the chips 30 to another location, for example, within the manufacturing plant or even to another manufacturing plant. In such a case, it is desirable to secure the chips 30 temporarily to a substrate. Accordingly, a mixture of straight chain hydrocarbon compounds, containing at least ninety percent by weight of docosane, is the preferred adhesive to be used here, as it is both tacky and transparent, thus enabling the chips to be dropped onto the adhesive and inspected through the transparent substrate, respectively. By releasing the vacuum in chamber 22, the chips 30 can be dropped or deposited onto a transparent substrate 51 coated with this adhesive 52. Alternatively, the chips can be placed onto the substrate and the docosane mixture can be deposited over both the chips and the substrate by conventional vapor deposition techniques. The tackiness of the docosane mixture 52 will provide sufficient adherence to hold the chips 30 in position, as shown in FIG. 5. Moreover, the transparency of the docosane mixture, coupled with the use of the transparent substrate 51, allows one to visually inspect the active side of the chips, which are face-down on the substrate. Finally, the high vapor pressure of the docosane mixture makes it possible to remove the chips in it in the same manner in which the chips were removed from fluorene. Again, there will be complete volatilization of the adhesive with no contaminating residues to interfere with the encapsulation of the chips or with the operating characteristics of the devices.

(3) Preferred examples (a) Fluorene.—The use of a thermode device with an operating temperature of from 200° C. to 400° C. to remove chips held by some adhesive to a substrate requires that the adhesive not pyrolyze and decompose, since it might then be insoluble in solvents used for cleaning prior to encapsulation. Rather, such an adhesive must vaporize completely, leaving no traces of contamination. Moreover, the adhesive must be inert to the acid etchants commonly used for separating the silicon slice into individual chips. The use of the hydrocarbon compound fluorene

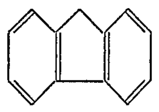

is an improvement over other materials commonly in use; its melting point of 116° C. and boiling point of 295° C. are in the proper range to assure good solidification. Moreover, it completely vaporizes before its decomposition temperature is reached.

To demonstrate the efficacy of the procedure, eight device slices were mounted, active side down, onto sapphire discs with fluorene. The slices were mechanically lapped and then separated using an aqueous chemical etchant common in the practice of the art. All of the slices adhered during lapping and separation, and there appeared to be no underetching on the active side of the devices. To remove the chips from the sapphire disc, it was only necessary to put the disc on a hot plate, maintained at 300° C. to 350° C., for ½ to 1 minute. The fluorene vaporized completely, leaving the chips in their original orientation and unattached to the substrate.

Fluorene has the following advantages as a mounting medium:

(a) It is a pure chemical compound, widely available.
(b) It is easily purified.
(c) It is a pure hydrocarbon.
(d) It has a sharp melting point and is very fluid when molten so that slices are easily made coplanar with the mounting disc.
(e) It volatilizes completely when heated at or above 300° C., leaving no residues or solid material.
(f) It is nontoxic.
(g) It bonds the slice firmly to the substrate.

(b) Docosane.—Usually chips are electrically tested and then transferred directly from the sapphire substrate to a ceramic substrate for final bonding onto metallized circuitry. However, there are occasions where it is desirable to store the chips temporarily, perhaps for shipping to another location, prior to bonding. In such cases, it is convenient to transfer the chips from the sapphire discs, used for support during the lapping operation, into an expanded array of chips on a glass disc for visual inspection, storage, and, perhaps, shipment to another location for bonding onto metallized substrates. While fluorene could be used here as the adhesive, the tackiness of docosane or of a mixture containing at least ninety weight percent docosane ($C_{22}H_{46}$) and the balance a mixture of straight-chain hydrocarbons ranging (from $C_{20}H_{42}$ to $C_{24}H_{50}$), allows the chips to be dropped onto the adhesive while holding the chips to the substrate sufficiently for these operations.

The transparency of this material permits visual inspection of the active side of the chips, which are face down on the substrate. Again, as with fluorene, the thermode tip used to pick up chips results in complete volatization of docosane and all of the constituent straight chain alkanes, leaving no residues or solid contaminates. Docosane has many of the same advantages listed for fluorene; but because of its low melting point and resultant tackiness, the use of docosane as a mounting medium for lapping and polishing is not contemplated.

What is claimed is:

1. The method of fabricating a semiconductor device, comprising the following steps of temporarily mounting a semiconductor body onto a substrate for processing:

applying a coating of a molten substance to at least one of the surfaces being joined, the substance consisting essentially of at least one compound selected from the group consisting of fluorene

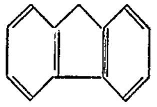

phenanthrene

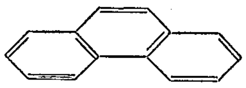

anthracene

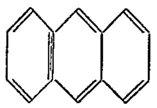

octadecane ($n\text{-}CH_3(CH_2)_{16}CH_3$), nonadecane ($n\text{-}CH_3(CH_2)_{17}CH_3$) eicosane ($N\text{-}CH_3(CH_2)_{18}CH_3$), heneicosane ($n\text{-}CH_3)(CH_2)_{19}CH_3$) docosane ($n\text{-}CH_3(CH_2)_{20}CH_3$), tricosane ($n\text{-}CH_3(CH_2)_{21}CH_3$), and tetracosane ($n\text{-}CH_3(CH_2)_{22}CH_3$)

allowing the assembly to cool, thereby to solidify the substance, performing operations on the semiconductor body, heating to cause release of the body, and removing the entirety of the substance by vaporization.

2. The method of claim 1, in which the vaporization occurs during the heating step in parting the body from the substrate.

3. The method of claim 1, in which the body is parted from the substrate by melting the substance and in which the substance is then vaporized in a subsequent heating step.

4. The method of claim 1, in which the operations include a procedure for removal of semiconductor material from the body by polishing.

5. The method of claim 4, which includes a procedure for removal of semiconductor material from the body by a chemical etchant.

6. The method of claim 5, which includes a procedure for removal of semiconductor material from the body by an aqueous chemical etchant.

7. The method of claim 6, which includes a procedure for dividing the body into a plurality of smaller bodies.

8. The method of claim 7, in which said at least one compound joining the body to the substrate is selected from the group consisting of fluorene, phenanthrene, and anthracene.

9. The method of claim 8, in which said at least one compound joining the body to the substrate is fluorene.

10. The method of claim 1, in which the substance consists essentially of at least two hydrocarbon compounds selected from the group consisting of octadecane, nonadecane, eicosane, heneicosane, docosane, tricosane, and tetracosane.

11. The method of claim 10, in which the substance consists essentially of at least ninety percent by weight of docosane.

12. The method of claim 11, in which the substance consists essentially of at least ninety-nine percent by weight of docosane.

References Cited

UNITED STATES PATENTS

| | | | |
|---|---|---|---|
| 2,297,691 | 10/1942 | Carlson | 96—1.5 |
| 3,054,709 | 9/1962 | Freestone et al. | 156—17 |

JACOB H. STEINBERG, Primary Examiner

U.S. Cl. X.R.

156—3, 155; 29—424

UNITED STATES PATENT OFFICE
CERTIFICATE OF CORRECTION

Patent No. 3,752,717 Dated August 14, 1973

Inventor(s) M. L. White

It is certified that error appears in the above-identified patent and that said Letters Patent are hereby corrected as shown below:

Column 5, line 29, after "chips" first occurrence, insert --embedded--.

line 40, after "that" cancel "the" and insert --that--.

Signed and sealed this 18th day of December 1973.

(SEAL)
Attest:

EDWARD M.FLETCHER,JR.
Attesting Officer

RENE D. TEGTMEYER
Acting Commissioner of Patents